(12) United States Patent
Chang et al.

(10) Patent No.: US 11,448,689 B2
(45) Date of Patent: Sep. 20, 2022

(54) ELECTRONIC DEVICE, SIGNAL VALIDATOR, AND METHOD FOR SIGNAL VALIDATION

(71) Applicant: PEGATRON CORPORATION, Taipei (TW)

(72) Inventors: Yi-Tso Chang, Taipei (TW); Chi-Wei Ting, Taipei (TW)

(73) Assignee: PEGATRON CORPORATION, Taipei (TW)

(*) Notice: Subject to any disclaimer, the term of this patent is extended or adjusted under 35 U.S.C. 154(b) by 428 days.

(21) Appl. No.: 16/809,108

(22) Filed: Mar. 4, 2020

(65) Prior Publication Data
US 2020/0363467 A1    Nov. 19, 2020

(30) Foreign Application Priority Data

May 17, 2019  (TW) ................................. 108117027

(51) Int. Cl.
| | | |
|---|---|---|
| *G01R 31/28* | (2006.01) | |
| *G01R 31/26* | (2020.01) | |
| *G01R 31/317* | (2006.01) | |

(52) U.S. Cl.
CPC ..... *G01R 31/2849* (2013.01); *G01R 31/2601* (2013.01); *G01R 31/31725* (2013.01)

(58) Field of Classification Search
CPC ............ G01R 31/2884; G01R 31/3187; G01R 31/31924; G01R 21/00; G01R 31/309; G01R 31/31715; G01R 31/318541; G01R 31/001; G01R 31/31915; G01R 31/3193; G01R 31/2812; G01R 31/2853;
(Continued)

(56) References Cited

U.S. PATENT DOCUMENTS

| | | | | | |
|---|---|---|---|---|---|
| 4,176,780 | A | * | 12/1979 | Sacher | ............... G01R 31/2806 714/736 |
| 4,714,875 | A | * | 12/1987 | Bailey | ............... G01R 31/2637 324/73.1 |

(Continued)

FOREIGN PATENT DOCUMENTS

| | | |
|---|---|---|
| CN | 101398776 | 4/2009 |
| CN | 101436154 | 5/2009 |

(Continued)

*Primary Examiner* — Vinh P Nguyen
(74) *Attorney, Agent, or Firm* — J.C. Patents

(57) ABSTRACT

An electronic device, a signal validator, and a method for signal validation are provided. The electronic device includes a circuit board generating a plurality of signals and a signal validator. The signal validator records a current voltage level of each signal as a sequence code and records a time interval between the sequence code and a previous sequence code as a delay time corresponding to the sequence code when a voltage level of one of the plurality of signals changes. The signal validator sequentially determines whether the sequence code matches with a prearranged sequence code. When the sequence code matches with the prearranged sequence code, the signal validator determines whether each delay time corresponding to each sequence code exceeds a predetermined delay time. When the delay time is less than the predetermined delay time, the signal validator determines that the plurality of signals passes signal validation.

11 Claims, 4 Drawing Sheets

(58) Field of Classification Search
CPC ............ G01R 31/3167; G01R 31/2801; G01R 31/31708; G01R 31/3183; G01R 31/318536; G01R 31/318555; G01R 31/2882; G01R 31/31725; G01R 31/28; G01R 31/318572; G04F 1/005; G06F 11/2733; G06F 13/40; G06F 11/00
See application file for complete search history.

(56) References Cited

U.S. PATENT DOCUMENTS

| | | | |
|---|---|---|---|
| 6,054,863 A * | 4/2000 | Morrison | G01R 31/2803 324/763.01 |
| 6,801,049 B2 | 10/2004 | Ishida et al. | |
| 6,828,815 B2 | 12/2004 | Ishida et al. | |
| 8,407,372 B2 * | 3/2013 | Wang | G06F 11/3058 710/10 |
| 2003/0016044 A1 | 1/2003 | Ishida et al. | |
| 2004/0160240 A1 | 8/2004 | Ishida et al. | |
| 2004/0163023 A1 | 8/2004 | Ishida et al. | |
| 2006/0212266 A1 * | 9/2006 | Chen | G01R 31/2803 702/182 |

FOREIGN PATENT DOCUMENTS

| | | |
|---|---|---|
| TW | 500926 | 9/2002 |
| TW | 200632637 | 9/2006 |

* cited by examiner

ELECTRONIC DEVICE, SIGNAL VALIDATOR, AND METHOD FOR SIGNAL VALIDATION

CROSS-REFERENCE TO RELATED APPLICATION

This application claims the priority benefit of Taiwan application serial no. 108117027, filed on May 17, 2019. The entirety of the above-mentioned patent application is hereby incorporated by reference herein and made a part of this specification.

BACKGROUND

Technical Field

The present disclosure relates to a signal processing technology, and in particular, to an electronic device, a signal validator, and a method for signal validation.

Related Art

During designing of an electronic device, to check whether each signal from a printed circuit board of the electronic device meets a design requirement, a designer generally measures a pin located on the printed circuit board using a professional instrument (such as an oscilloscope) to obtain a detailed waveform of a signal, thereby sequentially determining a voltage level of the signal, an enabling sequence of a signal impulse, a duration of a delay time, and the like. Then, the designer adjusts software, hardware, firmware, and the like in an electronic system according to the foregoing measurement results, and repeats the foregoing manner to measure signals until all signals meet the design requirement. Although measurement and validation procedures for signals are very complicated and laborious, the foregoing practice is common during the designing of the electronic device.

If the electronic device continues to update or revise the software or the firmware, or failure occurs and the like, although the hardware of the electronic device is not adjusted, during each revision, the designer still needs to measure important signals from the electronic device, for example, measuring the signals related to turn-on and turn-off of the electronic device, to avoid adjusting to a primary and important turn-on function or other important functions when the electronic device is updated or revised. Therefore, how to enable a particular and important signal in the electronic device to be measured conveniently and repeatedly for a plurality of times without using assistance of a professional instrument or dismantling the electronic device is one of the problems to be resolved by a person skilled in the art.

SUMMARY

The present disclosure provides an electronic device, a signal validator, and a method for signal validation to easily determine whether an important signal related to a main function (such as turning on and shutdown in the electronic device) is abnormal, so that a designer or maintenance personnel can easily determine status of the electronic device, thereby saving manpower and time.

The electronic device in the embodiments of the present disclosure includes a circuit board and a signal validator. The circuit board is configured to generate a plurality of signals. The signal validator is coupled to the circuit board to obtain the signals. The signal validator records a current voltage level of each signal as a sequence code and records a time interval between the sequence code and a previous sequence code as a delay time corresponding to the sequence code when a voltage level of one of the signals changes. The signal validator sequentially determines whether the sequence code matches with a prearranged sequence code. When the sequence code matches with the prearranged sequence code, the signal validator determines whether each delay time corresponding to each sequence code exceeds a predetermined delay time. When the delay time is less than the predetermined delay time, the signal validator determines that the signals pass signal validation.

The method for signal validation in the embodiments of the present disclosure includes the following steps: obtaining a plurality of signals from a circuit board; when a voltage level of one of the signals changes, recording a current voltage level of each of the signals as a sequence code, and recording a time interval between the sequence code and a previous sequence code as a delay time corresponding to the sequence code; sequentially determining whether the sequence code matches with a prearranged sequence code; when the sequence code matches with the prearranged sequence code, determining whether each delay time corresponding to each sequence code exceeds a predetermined delay time; and when the delay time is less than the predetermined delay time, determining that the signals pass the signal validation.

The signal validator in the embodiments of the present disclosure is adapted to a circuit board, the circuit board being configured to generate a plurality of signals. The signal validator includes a memory and a controller. The controller is coupled to the memory. The controller is configured to record a current voltage level of each of the signals as a sequence code into the memory, and record a time interval between the sequence code and a previous sequence code as a delay time corresponding to the sequence code into the memory when a voltage level of one of the signals changes. The controller sequentially determines whether the sequence code matches with a prearranged sequence code. When the sequence code matches with the prearranged sequence code, the controller determines whether each delay time corresponding to each sequence code exceeds a predetermined delay time. When the delay time is less than the predetermined delay time, the controller determines that the signals passes signal validation.

Based on the foregoing, in the embodiments of the present disclosure, a period of operation of the main functions (such as turning on and shutdown of an electronic device) is considered as the signal validation period during designing, the signal validator records the voltage levels and the delay times of the signals related to the main functions at the beginning of the signal validation period, automatically validates whether the voltage levels of the signals match with the prearranged sequence codes, and after it is determined that the voltage levels of the signals match with the prearranged sequence codes, determines whether a delay time that is of different signals and that is between time points at which voltage levels of the different signals change matches with the predetermined delay time. When the sequence code matches with the prearranged sequence codes and the delay time is less than the predetermined delay time, it is determined that the signals pass the signal validation. Therefore, when the electronic device updates or revises software or firmware, or needs to measure the signals related to the main functions due to a fault, the signal validator or the method for signal validation may be directly used to determine whether the signals related to the main functions are abnormal, so that the designer or maintenance personnel can easily determine status of the electronic device, to replace the method of originally using an oscilloscope to measure the signals, thereby saving manpower and time.

To make the features and advantages of the present disclosure more comprehensible, a detailed description is made below with reference to the accompanying drawings by using embodiments.

DETAILED DESCRIPTION

Figure 1:
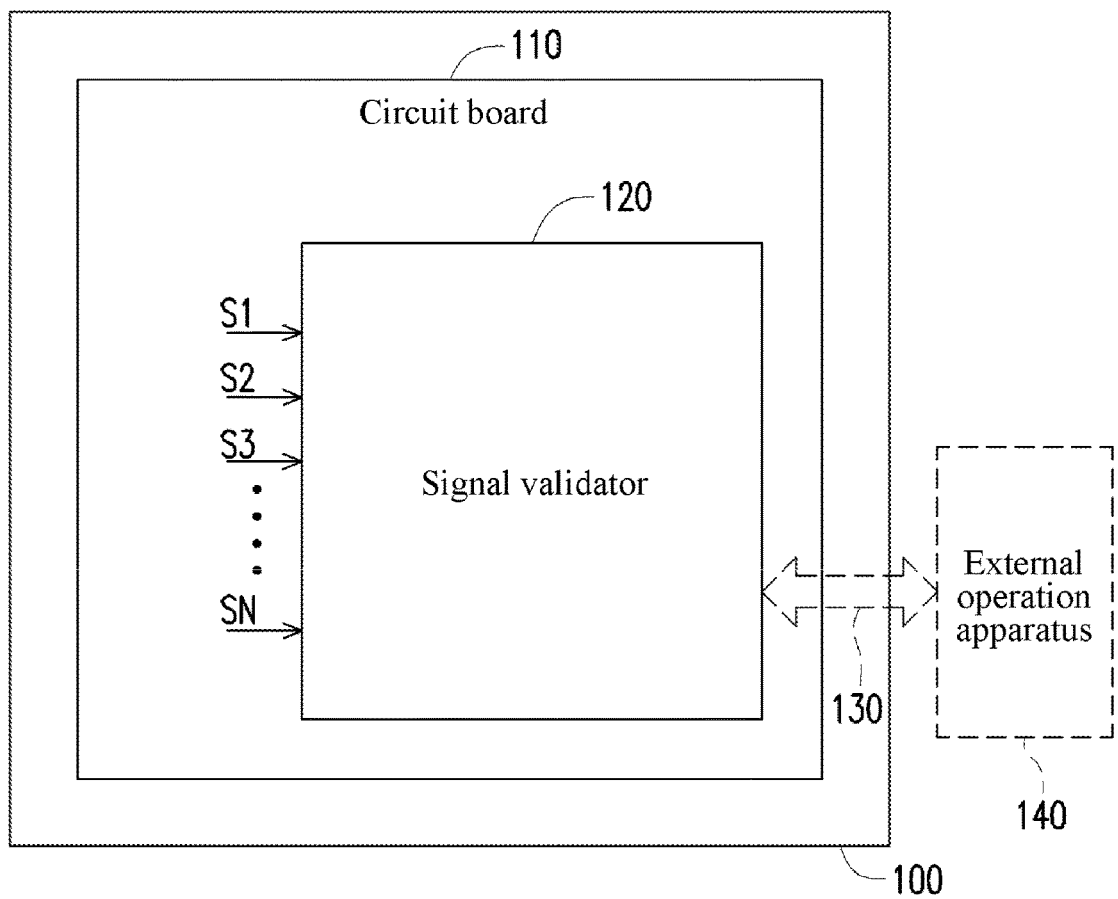
FIG. 1 is a block diagram of an electronic device according to an embodiment of the present disclosure.

FIG. 1 is a block diagram of an electronic device 100 according to an embodiment of the present disclosure. Referring to FIG. 1, the electronic device 100 mainly includes a circuit board 110 and a signal validator 120. The signal validator 120 may be disposed on the circuit board 110. The circuit board 110 may be a main board of the electronic device 100, and the main board may perform a plurality of functions. In this embodiment, these functions are divided into main functions (such as turn-on and turn-off of the electronic device) and application functions. A plurality of signals corresponding to the application functions may present different waveforms according to a requirement of a designer or firmware and software update. However, a plurality of signals corresponding to the main functions should present a fixed waveform. Otherwise, the main functions cannot be performed. Therefore, the signal validator 120 is designed to obtain a plurality of signals S1-SN (N is a positive integer) that is related to the main functions on the circuit board 110. The signal validator 120 records voltage levels and delay times of the signals S1-SN during operation (or referred to as a signal validation period) of the main functions (such as turning on and shutdown of the electronic device), and automatically determines whether the signals S1-SN match with a predetermined waveform sequence (or referred to as predetermined sequence information) that may allow normal operation of the main functions, to generate a validation result.

The signal validator 120 records a current voltage level of each of the signals S1-SN as a sequence code when a voltage level of one of the signals S1-SN changes. In addition, the signal validator 120 further records a time interval between the sequence code and a previous sequence code as a delay time corresponding to the sequence code. In other words, the so-called "delay time" is a time interval between a time point at which the voltage level of one of the signals S1-SN changes and a previous time point at which a voltage level of another one of the signals S1-SN changes.

The signal validator 120 uses the sequence code and the delay time corresponding to each sequence code to determine whether waveforms of the signals match with predetermined waveforms of the signals during designing, thereby determining whether the signals meet the design requirement. In other words, the signal validator 120 determines whether the signals pass signal validation according to the sequence code and each delay time corresponding to each sequence code. The signal validator 120 sequentially determines whether the recorded sequence code matches with a prearranged sequence code. When the recorded sequence code matches with the prearranged sequence code, the signal validator 120 determines whether each delay time corresponding to each sequence code exceeds a predetermined delay time. When the sequence code matches with the prearranged sequence code and each delay time is less than the predetermined delay time, the signal validator 120 determines that the signals pass the signal validation.

The electronic device 100 may further include an access bus 130 and an external operation apparatus 140, in which the access bus 130 is used for the signal validator 120 to transmit information. The external operation apparatus 140 is, for example, a notebook computer used by a designer, a consumer electronic device, an electronic device with a screen that may present information about a validation result, or the like. The signal validator 120 may transmit the validation result to the external operation apparatus 140 through the access bus 130 (such as an integrated circuit bus (I2C) or a system management bus (SMBUS)).

Figure 2:
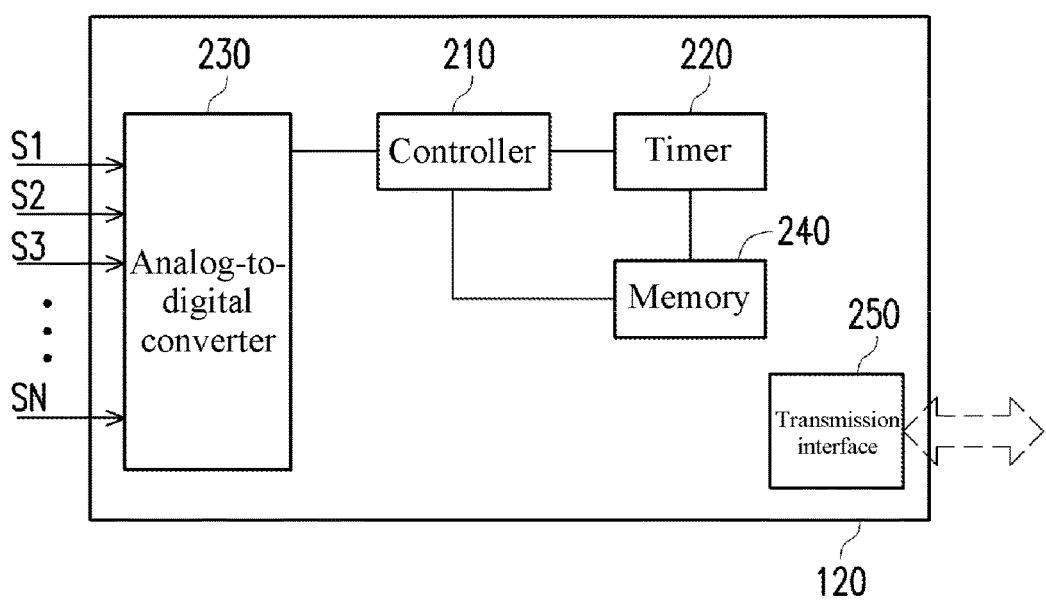
FIG. 2 is a block diagram of a signal validator according to an embodiment of the present disclosure.

FIG. 2 is a block diagram of a signal validator 120 according to an embodiment of the present disclosure. The signal validator 120 of FIG. 1 may be implemented using each element in FIG. 2. The signal validator 120 in FIG. 2 mainly includes a controller 210 and a timer 220, in which the timer 220 is coupled to the controller 210. The timer 220 accumulates a count value when enabled. The signal validator 120 may further include an analog-to-digital converter 230, a memory 240, and a transmission interface 250. The analog-to-digital converter 230 receives signals S1-SN from the circuit board 110, converts the signals S1-SN from an analog to a digital, and transmits the digital signals S1-SN to the controller 210. The memory 240 is configured to record the sequence code and the delay time corresponding to the sequence code. The memory 240 in this embodiment is a nonvolatile memory. When the electronic device 100 is powered off, if the signal validator 120 is operating to record the signals S1-SN, information such as voltage levels and delay times of the signals S1-SN that is recorded by the signal validator 120 before the electronic device 100 is powered off can be obtained from the memory 240, so that the designer can accordingly find out a problem. The transmission interface 250 is coupled to the controller 210. The controller 210 may transmit a validation result of determining whether the signal validation is passed to an external operation apparatus 140 through the transmission interface 250 and the access bus 130.

Figure 3:
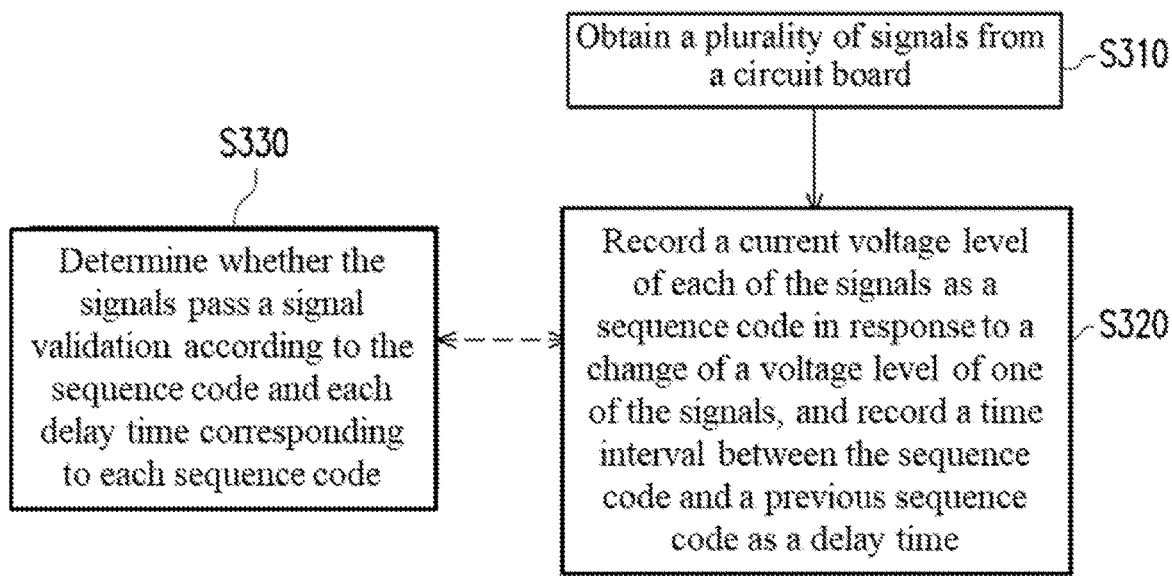
FIG. 3 is a flowchart of a method for signal validation according to an embodiment of the present disclosure.

For corresponding operations of the controller 210 and the timer 220 in the signal validator 120, reference may be made to FIG. 2 and FIG. 3 together. FIG. 3 is a flowchart of a method for signal validation according to an embodiment of the present disclosure. In step S310, a controller 210 obtains a plurality of signal S1-SN from a circuit board 110. In step S320, the controller 210 records a current voltage level of each of the signals S1-SN as a sequence code into a memory 240 in response to a change of a voltage level of one of the signals S1-SN, and records a time interval between the sequence code and a previous sequence code as a delay time corresponding to the sequence code into the memory 240. In step S330, the controller 210 determines whether the signals pass signal validation according to the sequence code and each delay time corresponding to each sequence code, thereby providing the validation result of determining whether the signal validation is passed. Because the controller 210 may perform step S320 and step S330 at the same time, a validation result of "not passing signal validation" is immediately provided to the external operation apparatus when the sequence code does not match with predetermined sequence information. In some embodiments, a person applying this embodiment may first perform step S320 and then perform step S330. If the entire electronic device is powered off when step S320 is performed, the person applying this embodiment needs to read related information recorded in step S320 in the memory 240, so as to determine where a problem occurs in the signals S1-SN by using the recorded sequence code and the delay time.

The signal validation period in this embodiment may be a turn-on period of an electronic device 100, a shutdown period of the electronic device 100, or a specific period during which the person applying this embodiment wants to inspect one or more specific signals. The turn-on period of the electronic device 100 is used as the signal validation period herein. In this case, the signal validator 120 is first started using a standby power before turn-on of the electronic device 100, to completely record the signals S1-SN during turn-on of the electronic device 100.

For ease of description and to allow the signal validator 120 in FIG. 1 and FIG. 2 to sequentially compare the sequence codes more easily, the person applying this embodiment may design the signals (such as signals S1-S4 in FIG. 5) in the following manner. When the electronic device is in normal operation during the signal validation period (such as a turn-on phase), the signals S1-S4 are sequentially converted from a disabled state (such as logic "0") into an enabled state (such as logic "1") until each of the signals S1-S4 is in the enabled state and the signal validator 120 is enabled to stop recording the signals S1-S4. In other words, when all the signals S1-S4 are in the enabled state, it indicates that the signal validation period has passed and the electronic device 100 is turned on.

Figure 4:
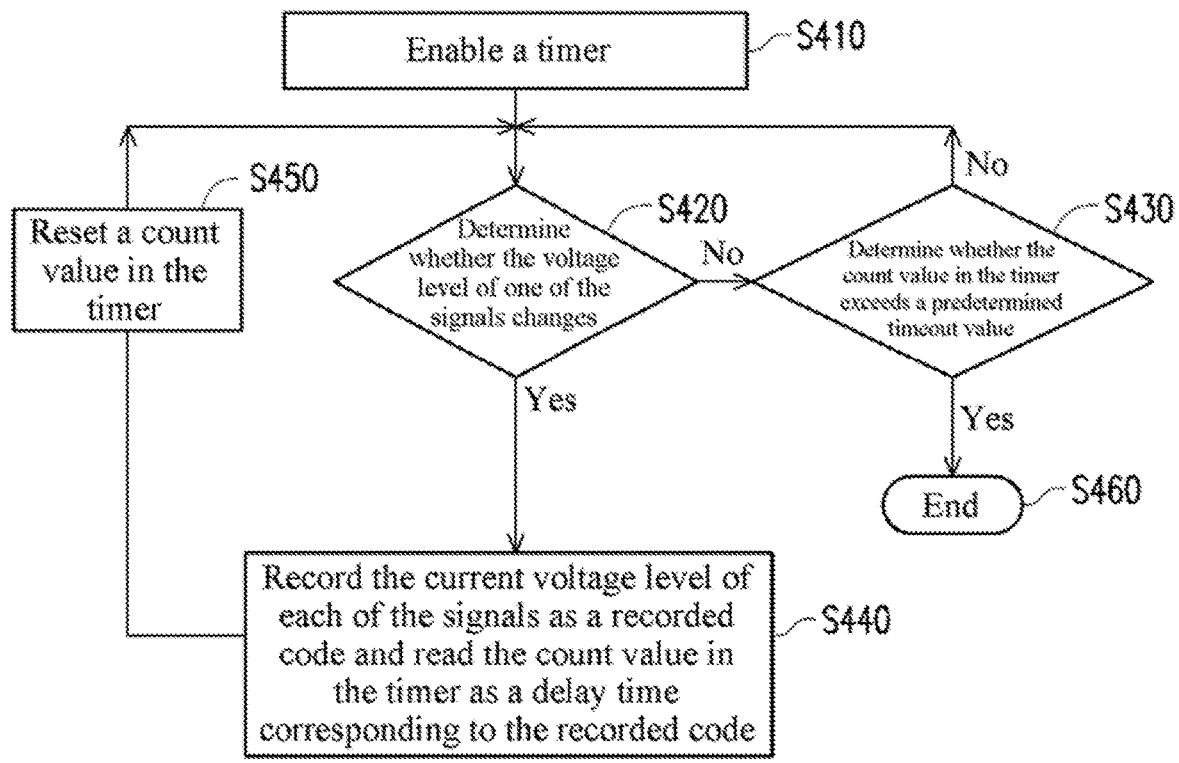
FIG. 4 is a detailed flowchart of step S320 in FIG. 3.
Figure 5:
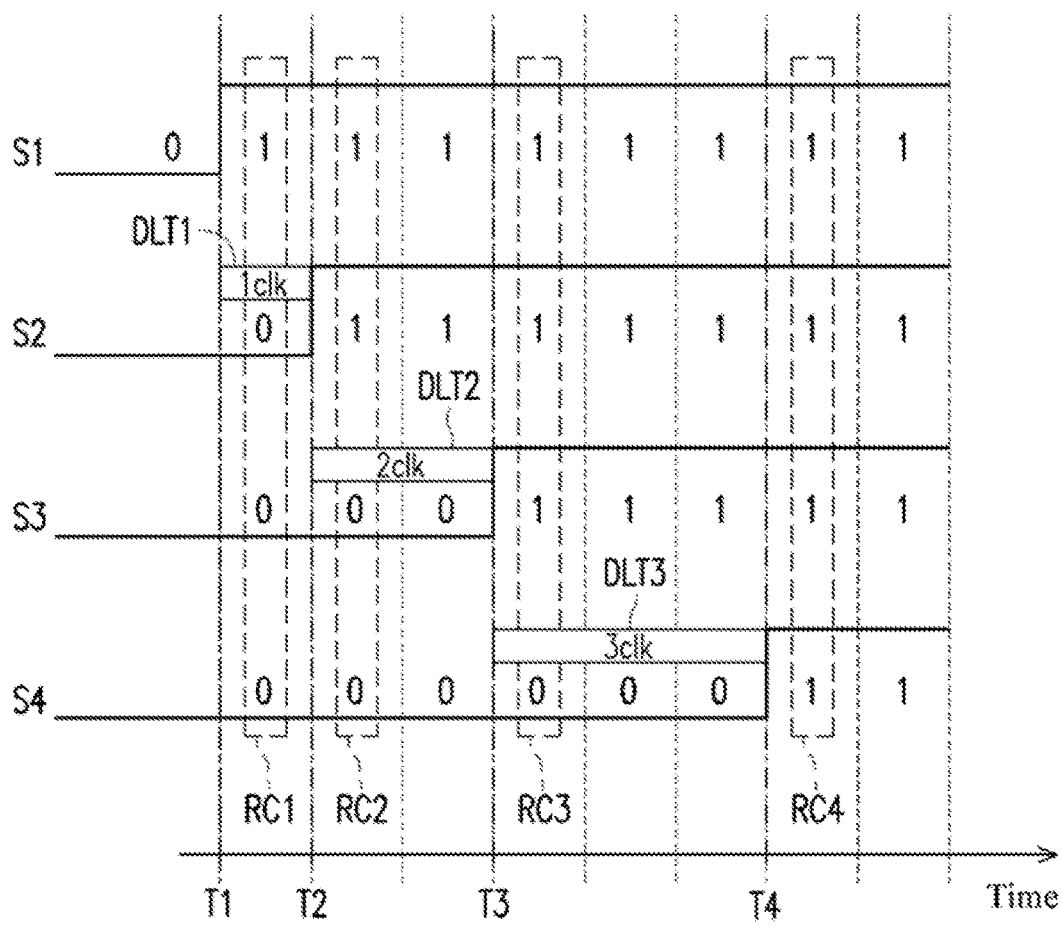
FIG. 5 is a schematic diagram of a waveform, a sequence code, and a delay time corresponding to the sequence code that are of a signal when an electronic device is in normal operation during a signal validation period.

FIG. 4 is a detailed flowchart of step S320 in FIG. 3. FIG. 5 is a schematic diagram of signal waveforms, sequence codes RC1-RC4, and delay times DLT1-DLT3 corresponding to the sequence codes RC1-RC4 that are of signals S1-S4 when an electronic device 100 is in normal operation during a signal validation period. Detailed steps of step S320 in FIG. 3 are described herein. Referring to FIG. 2, FIG. 4, and FIG. 5 together, in step S410, the controller 210 enables the timer 220 at a beginning of the signal validation period, so that a count value in the timer 220 starts to be accumulated.

In step S420, the controller 210 determines whether a voltage level of one of signals S1-S4 changes. If yes, step S440 is performed. In step S440, the controller 210 records a current voltage level of each of the signals S1-S4 as a sequence code into the memory 240, and reads the count value in the timer 220 as a delay time corresponding to the sequence code. In step S450, after the sequence code and the delay time corresponding to the sequence code are recorded into the memory 240, the controller 210 resets the count value in the timer 220, to accumulate the count value again. In contrast, if a determining result in step S420 is no, step S430 is performed.

In step S430, the controller 210 determines whether the count value in the timer 220 exceeds a predetermined timeout value set by a system. A reason for performing step S430 lies in that when the signal validator 120 is recording, the electronic device 100 may crash for a reason and the voltage level of the signal is not changed, so that the timer 220 of the signal validator 120 continuously accumulates the count value, or all the signals S1-S4 are already in an enabled state and the electronic device 100 is normally turned on. In other words, such situation is likely to be an emergency measure when the following two cases occur: all the signals S1-S4 are already in the enabled state, or the signals S1-S4 always maintain a same voltage level without change. Therefore, in order to avoid a case that the signal validator 120 constantly performs the method for signal validation and cannot stop recording, step S430 is used herein to allow the controller 210 to stop recording the sequence code and the delay time corresponding to the sequence code into the memory 240. Therefore, when the determining result in step S430 is yes, the controller 210 stops recording the sequence code and the delay time corresponding to the sequence code into the memory 240 in step S460. When the determining result in step S430 is no, the controller 210 returns to step S420.

A time point T1 in FIG. 5 is used as an example. In this case, the signal S1 changes from a disabled state (logic "0") into an enabled state (logic "1"), that is, a voltage level of the signal S1 changes. Therefore, the controller 210 records a current voltage level of each of the signals S1-S4 as the sequence code RC1 into the memory 240. In this embodiment, a current voltage level of the signal S1 is considered as a most significant bit (MSB), and a current voltage level of the signal S4 is considered as a least significant bit (LSB). That is, the sequence code RC1 is (1, 0, 0, 0). Furthermore, the so-called "delay time" is a time interval between a time point at which the voltage level of one of the signals changes and a previous time point at which a voltage level of another one of the signals changes. Currently, only the voltage level of the signal S1 changes, and the voltage level of the another signal does not change. Therefore, the controller 210 only records the sequence code RC1 (1, 0, 0, 0) at the time point T1 and does not record a corresponding delay time.

A time point T2 in FIG. 5 is used as an example. In this case, the signal S2 changes from the disabled state (logic "0") into the enabled state (logic "1"), that is, a voltage level of the signal S2 changes. Therefore, the controller 210 records a current voltage level of each of the signals S1-S4 as a sequence code RC2 (1, 1, 0, 0) into the memory 240. Furthermore, the so-called "delay time" is a time interval between the time point T2 at which the voltage level of the signal S2 changes and the previous time point T1 at which the voltage level of another one (that is, the signal S1) of the signals changes. Therefore, at the time point T2, the controller 210 not only records the sequence code RC2 (1, 1, 0, 0) into the memory 240 but also records a time interval between the sequence code RC2 and the previous sequence code RC1 as the delay time DLT1 (1 clk) into the memory 240. That is, at the time point T2, the count value in the timer 220 in FIG. 2 is 1. When the controller 210 has recorded the sequence code RC2 and the delay time DLT1 into the memory 240, the controller 210 resets the count value in the timer 220.

By analogy, the controller 210 records a sequence code RC3 (1, 1, 1, 0) and a time interval between the sequence code RC3 and the previous sequence code RC2 as a corresponding delay time DLT2 (2 clk) into the memory 240 at the time point T3. The controller 210 records a sequence code RC4 (1, 1, 1, 1) and a time interval between the sequence code RC4 and the previous sequence code RC3 as the corresponding delay time DLT3 (3 clk) into the memory 240 at the time point T4. In other words, if the sequence codes RC1-RC4 are hexadecimal values, the sequence codes RC1-RC4 are visually enabled sequentially. This manner is used by a designer to find out a problem when the signals S1-S4 are arranged. After the time point T4, because all of the signals S1-S4 are in the enabled state, the controller 210 proceeds to step S460 from step S430 in FIG. 4 to stop recording.

Because FIG. 5 shows a situation in which the electronic device is in normal operation during the signal validation period, the signal validator 120 in FIG. 2 uses the information shown in FIG. 5 as default predetermined sequence information when determining whether the signals S1-S4 pass the signal validation. The predetermined sequence information in this embodiment includes a plurality of prearranged sequence codes and a predetermined delay time. The predetermined delay time may be set according to a requirement of a person applying this embodiment.

Figure 6:
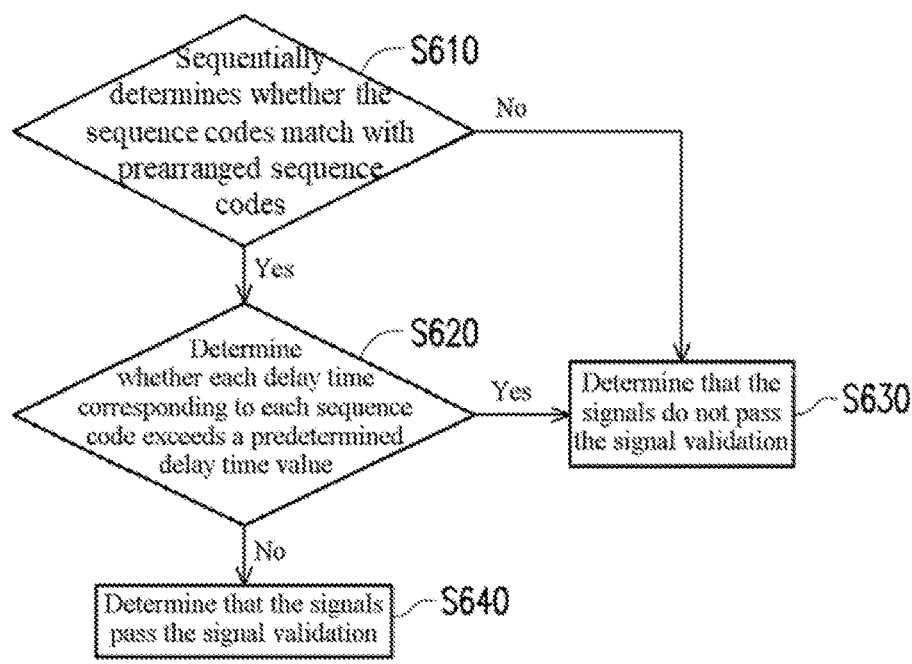
FIG. 6 is a detailed flowchart of step S330 in FIG. 3.

FIG. 6 is a detailed flowchart of step S330 in FIG. 3. Referring to FIG. 2 and FIG. 6 together, in step S610, the controller 210 sequentially determines whether the sequence codes RC1-RC4 match with prearranged sequence codes in the predetermined sequence information. The prearranged sequence codes in this embodiment are (1, 0, 0, 0), (1, 1, 0, 0), (1, 1, 1, 0), and (1, 1, 1, 1) by default. The controller 210 sequentially compares the sequence codes RC1-RC4 with the prearranged sequence codes according to a sequence in which the sequence codes RC1-RC4 are recorded. For example, the controller 210 compares the sequence code RC1 with (1, 0, 0, 0), compares the sequence code RC2 with (1, 1, 0, 0), compares the sequence code RC3 with (1, 1, 1, 0), and compares the sequence code RC4 with (1, 1, 1, 1). In this embodiment, because the controller 210 may obtain only some sequence codes (for example, obtaining only the sequence codes RC1-RC2 without recording the sequence codes RC3-RC4), the controller 210 compares only the sequence code RC1 with (1, 0, 0, 0) and the sequence code RC2 with (1, 1, 0, 0), and then compare (1, 1, 1, 0) with the sequence code RC3 after being recorded, and so on.

When a determining result in step S610 is no, it indicates that the signals S1-S4 do not pass the signal validation. Therefore, step S630 is performed. The controller 210 determines that the signals do not pass the signal validation, and provides a validation result of "not passing signal validation" to the external operation apparatus 140. In contrast, when a determining result in step S610 is yes, that is, the sequence codes RC1-RC4 sequentially match with the prearranged sequence codes, step S620 is performed. The controller 210 determines whether each of the delay times DLT1-DLT3 corresponding to each of the sequence codes RC1-RC4 exceeds the predetermined delay time (assumed as 5 clk herein).

When a determining result in step S620 is yes, it indicates that the signals S1-S4 are delayed for too long and do not pass the signal validation. Therefore, step S630 is performed, the controller 210 provides a validation result of "not passing signal validation" to the external operation apparatus 140. In contrast, when a determining result in step S620 is no, it indicates that the signals S1-S4 are not delayed for too long and pass the signal validation. Therefore, step S640 is performed. The controller 210 determines that the signals pass the signal validation, and provides a validation result of "passing signal validation" to the external operation apparatus 140.

In the embodiment of the present disclosure, all steps in FIG. 3 are implemented using the controller of the signal validator. The person applying this embodiment may alternatively implement a related step in FIG. 3 using other methods. For example, in an embodiment, the controller 210 implements step S320 related to "recording a sequence code of a signal and a delay time corresponding to the sequence code" in FIG. 3, and transmits "the sequence code of the signal and the delay time corresponding to the sequence code" to the external operation apparatus 140, and the external operation apparatus implements a related step such as step S330 related to "determining, according to the sequence code and each delay time corresponding to each sequence code, whether the signals pass the signal validation" in FIG. 3.

Figure 7:
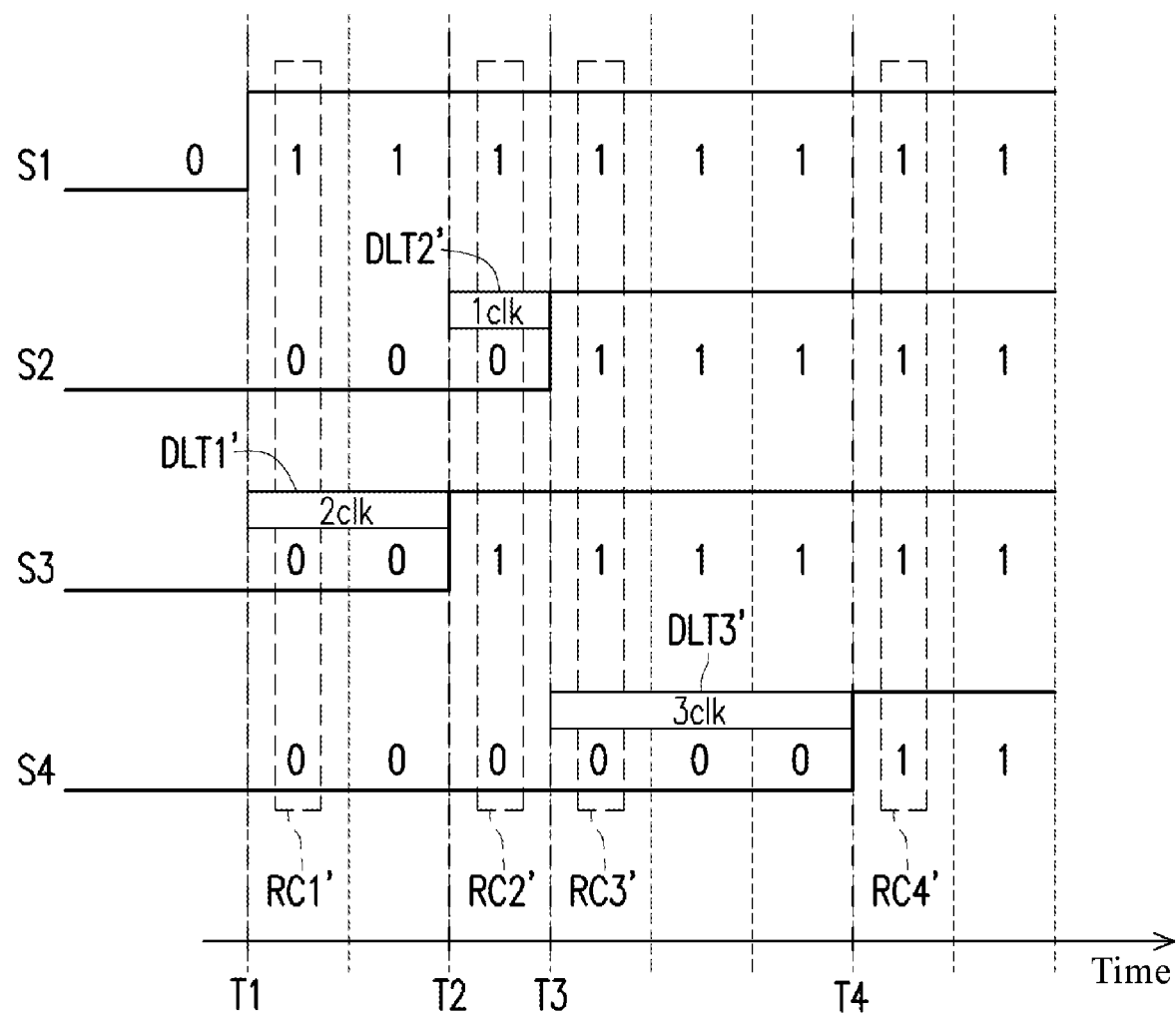
FIG. 7 is a schematic diagram of a waveform, a sequence code, and a delay time corresponding to the sequence code that are of a signal when an electronic device is in abnormal operation during a signal validation period.

FIG. 7 is a schematic diagram of waveforms, sequence codes RC1'-RC4', and delay times DLT1'-DLT3' corresponding to the sequence codes RC1'-RC4' that are of signals S1-S4 when an electronic device is in abnormal operation during the signal validation period. Referring to a time point T1' in FIG. 7, in this case, the signal Si is converted from the disabled state (logic "0") into the enabled state (logic "1"), that is, a voltage level of the signal S1 changes. Therefore, at the time point T1', a controller 210 records the sequence code RC1' (1, 0, 0, 0) into a memory 240 and does not record a corresponding delay time. Referring to a time point T2' in FIG. 7, in this case, the signal S3 is converted from the disabled state (logic "0") into the enabled state (logic "1"), that is, a voltage level of the signal S3 changes. Therefore, at the time point T2', the controller 210 records a sequence code RC2' (1, 0, 1, 0) and the corresponding delay time DLT1' (2 clk) into the memory 240. Referring to a time point T3' in FIG. 7, in this case, the signal S2 is converted from the disabled state (logic "0") into the enabled state (logic "1"), that is, a voltage level of the signal S2 changes. Therefore, at the time point T3', the controller 210 records a sequence code RC3' (1, 1, 1, 0) and a corresponding delay time DLT2' (1 clk) into the memory 240. Referring to a time point T4' in FIG. 7, in this case, the signal S4 is converted from the disabled state (logic "0") into the enabled state (logic "1"), that is, a voltage level of the signal S4 changes. Therefore, at the time point T4', the controller 210 records the sequence code RC4' (1, 1, 1, 1) and the corresponding delay time DLT3' (3 clk) into the memory 240.

It may be learned from the above that the sequence code RC1' to the sequence code RC4' are respectively (1, 0, 0, 0), (1, 0, 1, 0), (1, 1, 1, 0), and (1, 1, 1, 1), and in step S330 in FIG. 3 or in step S610 in FIG. 6, the controller 210 sequentially determines whether the sequence codes RC1'-RC4' match with prearranged sequence codes (1, 0, 0, 0), (1, 1, 0, 0), (1, 1, 1, 0), and (1, 1, 1, 1) in the predetermined sequence information. Because the sequence code RC2' (1, 0, 1, 0) is not equal to (1, 1, 0, 0) in the prearranged sequence codes, the controller 210 in FIG. 2 proceeds to step S630 from step S610 to obtain a validation result of "not passing signal validation".

After recording the sequence code and the delay time corresponding to the sequence code into the memory 240, the controller 210 in this embodiment may further perform simple data processing on the information to facilitate information reading of the external operation apparatus 140. For example, the controller 210 in FIG. 2 may convert the sequence code and the delay time corresponding to the sequence code into graphical information that may present a waveform to be used as a part of the validation result. The "graphical information" in the embodiments of the present disclosure is, for example, a waveform pattern presented by the signals S1-S4 in FIG. 5 and FIG. 7. The waveform pattern may present visual signals using information such as a voltage level and a time interval of a signal.

Based on the foregoing, in the embodiments of the present disclosure, a period of operation of the main functions (such as turn-on and turn-off of an electronic device) is considered as the signal validation period, the signal validator records voltage levels and delay times of signals related to the main functions at the beginning of the signal validation period, automatically validates whether the voltage levels of the signals match with the prearranged sequence codes, and after it is determined that the voltage levels of the signals match with the prearranged sequence codes, determines whether a delay time between time points at which voltage levels of different signals change matches with the predetermined delay time. When the sequence code matches with the prearranged sequence codes and the delay time is less than the predetermined delay time, it is determined that the signals pass the signal validation. Therefore, when the electronic device updates or revises software or firmware, or needs to measure the signals related to the main functions due to a fault, the signal validator or the method for signal validation may be directly used to determine whether the signals related to the main functions are abnormal, so that the designer or maintenance personnel can easily determine status of the electronic device, to replace the method of originally using an oscilloscope to measure the signals, thereby saving manpower and time.

Although the present disclosure is described with reference to the above embodiments, the embodiments are not intended to limit the present disclosure. A person of ordinary skill in the art may make variations and modifications without departing from the spirit and scope of the present disclosure. Therefore, the protection scope of the present disclosure should be subject to the appended claims.

What is claimed is:

1. An electronic device, comprising:
a circuit board configured to generate a plurality of signals; and
a signal validator coupled to the circuit board to obtain the plurality of signals,
wherein when a voltage level of one of the plurality of signals changes, the signal validator records a current voltage level of each of the plurality of signals as a sequence code and records a time interval between the sequence code and a previous sequence code as a delay time corresponding to the sequence code,
the signal validator sequentially determines whether the sequence code matches with a prearranged sequence code,
when the sequence code matches with the prearranged sequence code, the signal validator determines whether each delay time corresponding to each sequence code exceeds a predetermined delay time, and
when the delay time is less than the predetermined delay time, the signal validator determines that the plurality of signals pass signal validation.

2. The electronic device according to claim 1, wherein the signal validator comprises:
a timer; and
a controller coupled to the timer, wherein the controller enables the timer at a beginning of a signal validation period and obtains the plurality of signals from the circuit board, wherein
the timer accumulates a count value when enabled, and when the voltage level of one of the plurality of signals changes, the controller records the current voltage level of each signal as the sequence code, reads the count value in the timer as the delay time corresponding to the sequence code, and resets the count value in the timer after recording the sequence code and the delay time corresponding to the sequence code.

3. The electronic device according to claim 2, wherein the signal validation period is a turn-on period of the electronic device or a shutdown period of the electronic device.

4. The electronic device according to claim 1, wherein the signal validator converts the sequence code and the delay time corresponding to the sequence code into graphical information.

5. A method for signal validation, comprising:
receiving a plurality of signals from a circuit board;
when a voltage level of one of the plurality of signals changes, recording a current voltage level of each of the plurality of signals as a sequence code and recording a time interval between the sequence code and a previous sequence code as a delay time corresponding to the sequence code;
sequentially determining whether the sequence code matches with a prearranged sequence code;
when the sequence code matches with the prearranged sequence code, determining whether each delay time corresponding to each sequence code exceeds a predetermined delay time; and
when the delay time is less than the predetermined delay time, determining that the plurality of signals passes signal validation.

6. The method for signal validation according to claim 5, the step of when the voltage level of one of the plurality of signals changes, recording the current voltage level of each of the plurality of signals as the sequence code and recording the time interval between the sequence code and the previous sequence code as the delay time corresponding to the sequence code comprises:
enabling a timer at a beginning of a signal validation period, wherein the timer accumulates a count value when enabled;
determining whether the voltage level of one of the plurality of signals changes;
when the voltage level of one of the plurality of signals changes, recording the current voltage level of each of the plurality of signals as the sequence code, and reading the count value in the timer as the delay time corresponding to the sequence code; and
resetting the count value in the timer after recording the sequence code and the delay time corresponding to the sequence code.

7. The method for signal validation according to claim 6, further comprising:
determining whether the count value in the timer exceeds a predetermined timeout value; and
when the count value exceeds the predetermined timeout value, stopping recording the sequence code and the delay time corresponding to the sequence code.

8. A signal validator adapted to a circuit board, the circuit board being configured to generate a plurality of signals, and the signal validator comprising:
a memory; and
a controller coupled to the memory, wherein the controller is configured to record a current voltage level of each of the plurality of signals as a sequence code into the memory, and record a time interval between the sequence code and a previous sequence code as a delay time corresponding to the sequence code into the memory when a voltage level of one of the plurality of signals changes, the controller sequentially determines whether the sequence code matches with a prearranged sequence code, when the sequence code matches with the prearranged sequence code, the controller determines whether each delay time corresponding to each sequence code exceeds a predetermined delay time, and when the delay time is less than the predetermined delay time, the controller determines that the plurality of signals passes signal validation.

9. The signal validator according to claim 8, wherein the signal validator further comprises:
a timer coupled to the controller, the controller enabling the timer at a beginning of a signal validation period and obtaining the plurality of signals of the circuit board, wherein
the timer accumulates a count value when enabled, and when the voltage level of one of the plurality of signals changes, the controller records the current voltage level of each of the plurality of signals as a sequence code into the memory, reads the count value in the timer as the delay time of the sequence code, and resets the count value in the timer after recording the sequence code and the delay time corresponding to the sequence code into the memory.

10. The signal validator according to claim 9, wherein the signal validator is applied in an electronic device, and the signal validation period is a turn-on period of the electronic device or a shutdown period of the electronic device.

11. The signal validator according to claim 8, wherein that the controller sequentially determines whether the sequence code matches with the prearranged sequence code comprises:
when the sequence code matches with the prearranged sequence code, determining, by the controller, whether each delay time corresponding to each sequence code exceeds a predetermined delay time; and
when the sequence code matches with the prearranged sequence code and the delay time is less than the predetermined delay time, determining, by the controller, that the plurality of signals passes the signal validation.

* * * * *